US008158015B2

(12) United States Patent
Lin et al.

(10) Patent No.: US 8,158,015 B2
(45) Date of Patent: Apr. 17, 2012

(54) FITTING METHODOLOGY OF ETCHING TIMES DETERMINATION FOR A MASK TO PROVIDE CRITICAL DIMENSION AND PHASE CONTROL

(75) Inventors: Cheng-Ming Lin, Yunlin County (TW); Joy Huang, Chiayi County (TW)

(73) Assignee: Taiwan Semiconductor Manufacturing Company, Ltd., Hsin--Chu (TW)

( * ) Notice: Subject to any disclaimer, the term of this patent is extended or adjusted under 35 U.S.C. 154(b) by 1078 days.

(21) Appl. No.: 11/686,773

(22) Filed: Mar. 15, 2007

(65) Prior Publication Data

US 2008/0226991 A1 Sep. 18, 2008

(51) Int. Cl.
*G01L 21/30* (2006.01)
(52) U.S. Cl. ............................................ 216/59; 216/60
(58) Field of Classification Search .................... 216/24, 216/59, 60
See application file for complete search history.

(56) References Cited

U.S. PATENT DOCUMENTS

| 6,207,333 | B1 | 3/2001 | Adair et al. |
| 6,630,408 | B1 | 10/2003 | Tzu et al. |
| 6,872,496 | B2 | 3/2005 | Lin |
| 6,939,476 | B1 * | 9/2005 | Griffin ............................ 216/59 |
| 7,354,682 | B1 | 4/2008 | Capodieci |
| 2004/0081917 | A1 | 4/2004 | Tanaka et al. |
| 2007/0015089 | A1 * | 1/2007 | Peters et al. .................. 430/313 |
| 2007/0065731 | A1 | 3/2007 | Ishiwata |
| 2007/0092808 | A1 * | 4/2007 | Shiota et al. ....................... 430/5 |
| 2008/0113275 | A1 * | 5/2008 | Crawford et al. ................. 430/5 |
| 2008/0226991 | A1 | 9/2008 | Lin et al. |
| 2008/0254376 | A1 | 10/2008 | Lin et al. |

FOREIGN PATENT DOCUMENTS

TW 250376 3/2006

* cited by examiner

*Primary Examiner* — Binh X Tran
(74) *Attorney, Agent, or Firm* — Haynes and Boone, LLP

(57) ABSTRACT

The present disclosure provides a mask and a method of determining etching times for etching the mask. In one embodiment, values for a main etching time and an over-etching time are determined simultaneously based on a desired critical dimension (CD) parameter and a desired phase parameter for the mask.

18 Claims, 7 Drawing Sheets

FITTING METHODOLOGY OF ETCHING TIMES DETERMINATION FOR A MASK TO PROVIDE CRITICAL DIMENSION AND PHASE CONTROL

BACKGROUND

This invention relates to masks and, more particularly, to a method of modeling the main etching and over-etching time for a mask to simultaneously model mask critical dimension (CD) and phase shift.

Increasingly, chip makers are designing integrated circuits with critical dimension (CD) tolerances as tight as 32 nm. To meet such reduced feature sizes, phase shifting masks, instead of binary masks, are increasingly being used by chip makers. Conventional light sources and lenses, or binary masks cannot consistently transfer a chip design with such narrow device linewidths to a wafer. Phase shifting masks are effective in accommodating the printing of smaller device linewidths of wafers because such masks sharpen the light's effects on a resist during photoexposure.

Phase shifting masks conventionally include a mask layer, such as molybdenum silicide, deposited on a quartz substrate. The mask layer is then patterned, e.g., dry etched, to define a circuit pattern that is to be printed on a wafer. To pattern the mask layer to define the device features with the desired CD, a two step etching process is conventionally used. First, a main etching step is performed. The main etching step is responsible for much of the patterning of the mask layer as it is effective in removing unmasked portions of the mask layer. Second, an over-etching or side etching step is performed to further etch the mask layer. As a result of this two-step process, the phase shifting mask can be susceptible to significant phase variations. Therefore, there is a need for a modeling process to determine a main etching time and an over-etching time that will satisfy desired CD tolerances without imposing a significant variation in phase on the phase shifting mask.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
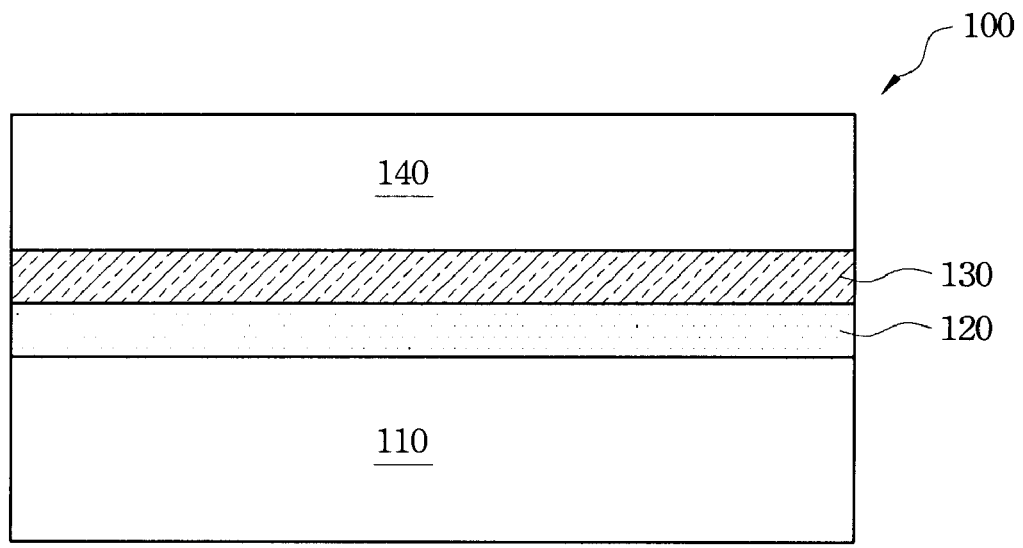
FIGS. 1a through 1e are sectional views of one embodiment of a mask at various fabrication stages according to one aspect of the present invention.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIGS. 1a through 1e are sectional views of an embodiment of a mask (mask, or reticle, collectively referred to as mask) 100 constructed according to aspects of the present disclosure. FIG. 1f is a top view of an embodiment of the mask 100 in FIG. 1e. Referring to FIGS. 1a through 1f, the mask 100 and a method of making the same are described.

Referring to FIG. 1a, the mask 100 may be a portion of a mask utilized in manufacturing a semiconductor wafer. The mask 100 includes a substrate 110. The substrate 110 may be a transparent substrate such as fused silica ($SiO_2$) relatively free of defects, calcium fluoride, or other suitable material.

The mask 100 includes a first attenuating layer 120 disposed on the substrate 110. The first attenuating layer 120 is designed to provide a phase shift to a radiation beam used to fabricate a semiconductor wafer during a lithography process. The first attenuating layer 120 may have a thickness such that a radiation beam directed toward and through the first attenuating layer 120 has a phase shift relative to the radiation beam directed through the air. The radiation beam is used on the mask 100 to form a pattern on a semiconductor wafer during a photolithography process. The radiation beam may be ultraviolet and/or can be extended to include other radiation beams such as ion beam, x-ray, extreme ultraviolet (EUV), deep ultraviolet (DUV), and other proper radiation energy. The thickness of the first attenuating layer 120 may have a tolerance of plus or minus about 15 degrees in terms of optical phase. In one embodiment, the first attenuating layer 120 has a phase shift about 180 degrees. More specifically, the first attenuating layer 120 may have a thickness about $\lambda/[2(n-1)]$, wherein $\lambda$ is the wavelength of the radiation beam projected on the mask 100 during a photolithography process, and n is refractive index of the first attenuating layer 120 relative to the specified radiation beam. In another embodiment, the first attenuating layer 120 may have a phase shift ranging between about 120 degrees and 240 degrees. Specifically, the first attenuating layer 120 may have a thickness ranging between $\lambda/[3\times(n-1)]$ and $2\lambda/[3\times(n-1)]$ to realize a desired phase shift. The first attenuating layer 120 may have a transmission less than one (or 100%) and more than zero. In another example, the first attenuating layer 120 may have a transmission higher than about 5%. The first attenuating layer 120 may include metal silicide such as MoSi or $ToSi_2$, metal nitride, iron oxide, inorganic material, other materials such as Mo, $Nb_2O_5$, Ti, Ta, CrN, $MoO_3$, MoN, $Cr_2O_3$, TiN, ZrN, $TiO_2$, TaN, $Ta_2O_5$, $SiO_2$, NbN, $Si_3N_4$, ZrN, $Al_2O_3N$, $Al_2O_3R$, or combinations thereof. The method of forming the first attenuating layer 120 may include chemical vapor deposition (CVD), physical vapor deposition (PVD), atomic layer deposition (ALD), plating, and/or other suitable processes.

The mask 100 includes a second attenuating layer 130 disposed on the first attenuating layer 120. The second layer 130 is designed as an absorption layer and is opaque to a radiation beam used for lithography processing. The second attenuating layer 130 has a transmission less than that of the first attenuating layer 120. In one embodiment, the second attenuating layer 130 has a transmission less than about 30%. The second attenuating layer 130 may utilize a material different from that of the first attenuating layer 120. The second attenuating layer 130 may be formed using a process similar to those used to form the first attenuating layer 120. The second attenuating layer 130 may include Cr, CrN, Mo, $Nb_2O_5$, Ti, Ta, CrN, $MoO_3$, MoN, $Cr_2O_3$, TiN, ZrN, $TiO_2$, TaN, $Ta_2O_5$, $SiO_2$, NbN, $Si_3N_4$, ZrN, $Al_2O_3N$, $Al_2O_3R$, or a combination thereof. The method of forming the second attenuating layer 130 may include CVD, PVD, ALD, plating, and/or other suitable processes similar to those used to form the first attenuating layer.

A resist layer 140 is formed on the second attenuating layer 130 for lithography patterning. The resist layer 140 can be formed by a spin-on coating method. The resist layer 140 may include chemical amplification resist (CAR).

Figure 1B:
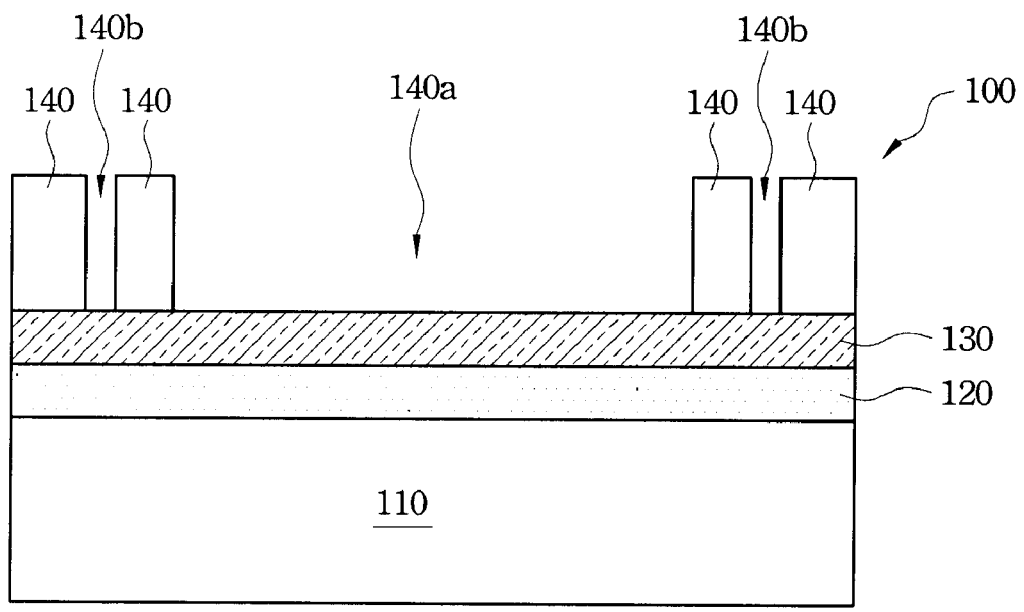

Referring to FIG. 1b, the resist layer 140 is patterned to form various openings such as openings 140a and 140b, designed according to aspects of the present disclosure, using a conventional process or a future developed technique. The second attenuating layer 130 is exposed within the openings 140a and 140b. In one example, the photolithography process includes soft baking, mask aligning, exposing, post-exposure baking, developing resist, and hard baking.

Figure 1C:
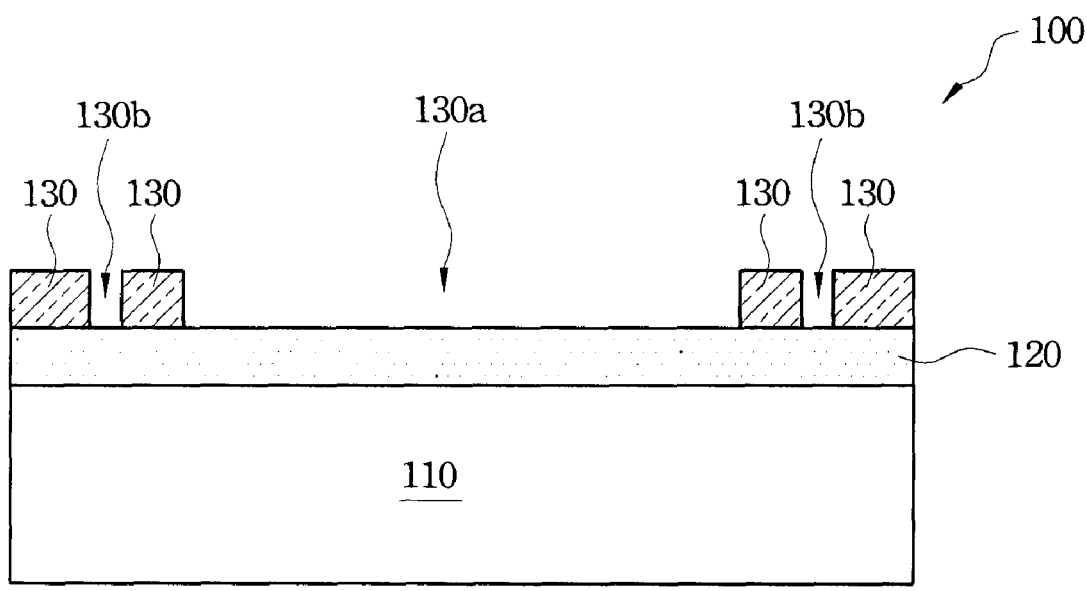

Referring to FIG. 1c, the second attenuating layer 130 is etched through the patterned resist layer 140 to form various openings 130a and 130b in the second attenuating layer 130 within the openings 140a and 140b. The first attenuating layer 120 is therefore exposed within the openings 130a and 130b. The etchant to etch the second attenuating layer 130 may be chosen or designed to have a higher etching selectivity over the first attenuating layer 120. The etchant may include halogens species such as fluorine, chlorine and bromine. The etch selectivity is preferred to be no less than about 10. The patterned resist layer 140 is removed after the etching of the second attenuating layer 130, using either wet stripping or plasma ashing.

Figure 1D:
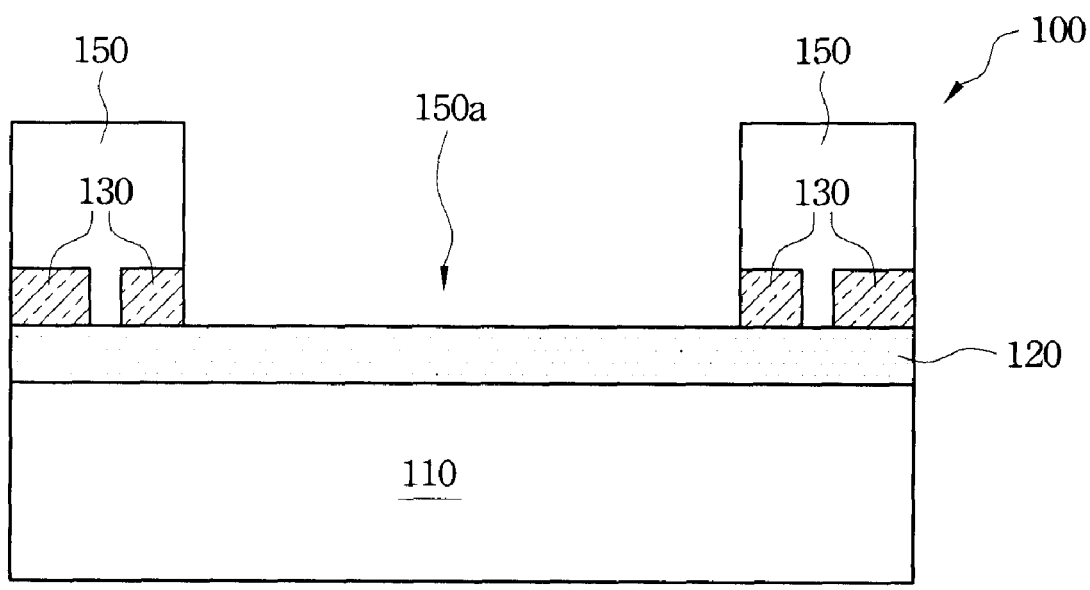

Referring to FIG. 1d, another resist layer 150 is formed on the first attenuating layer 120 within the openings 130a and 130b and on the patterned second attenuating layer 130. The resist layer 150 is then further patterned to form an opening 150a in the resist layer 150 to expose the underlying first attenuating layer 120 within the opening 150a. The resist layer 150 and the patterning thereof may be substantially similar to the resist layer 140 and the patterning thereof.

Figure 1E:
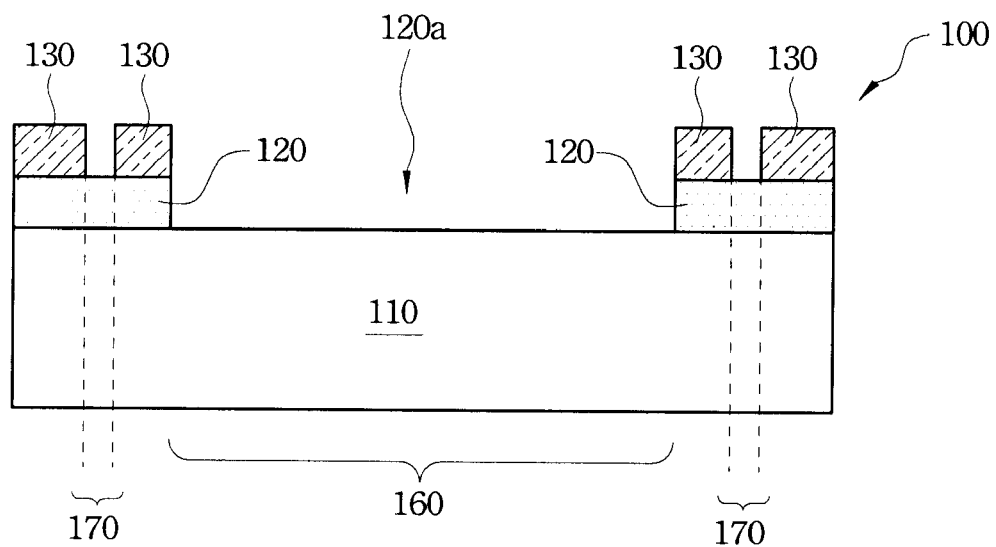
Figure 1F:
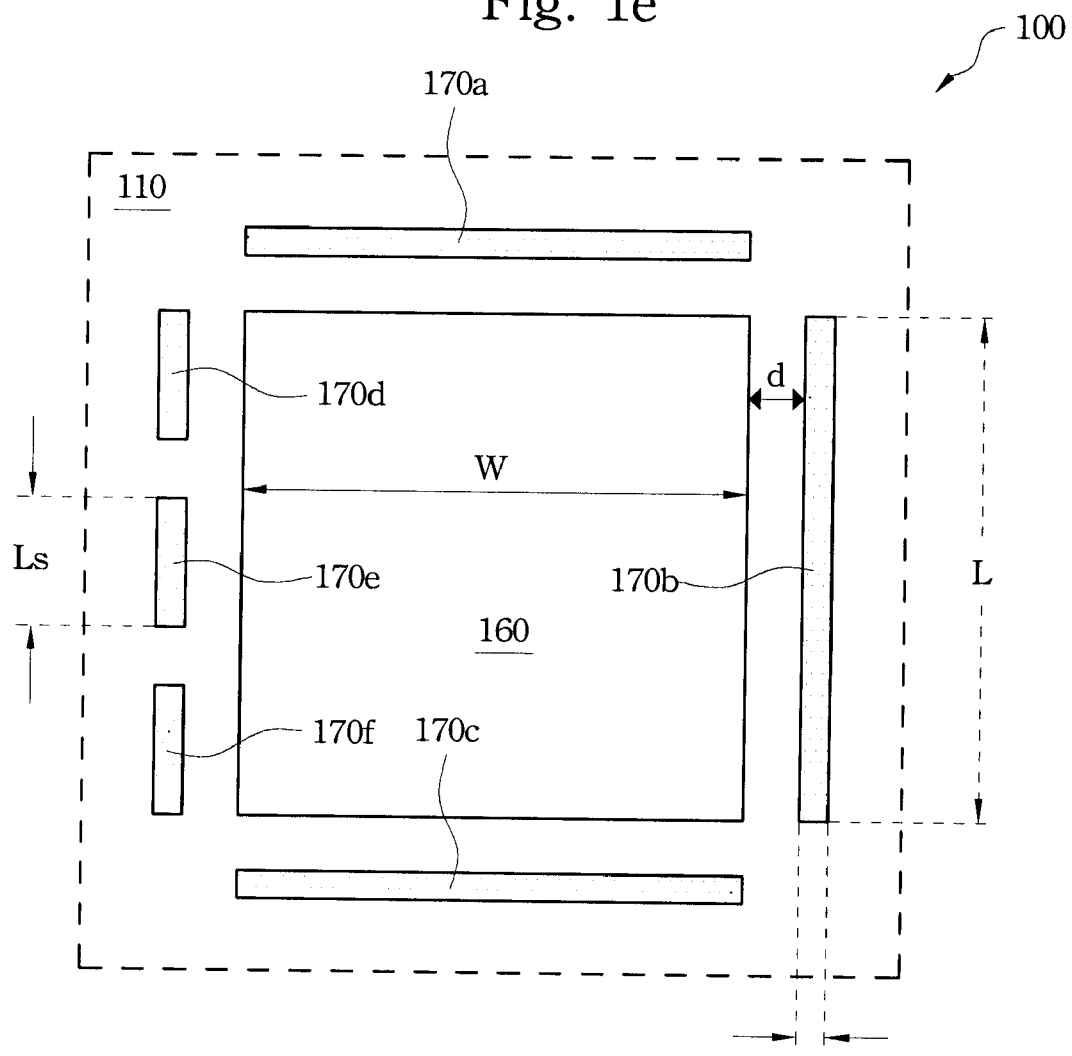
FIG. 1f is a top view of the mask of FIGS. 1a through 1e.

Referring to FIGS. 1e and 1f, the first attenuating layer 120 is etched through the patterned resist layer 150 to form an opening 120a in the first attenuating layer 120 within the openings 150a. The substrate 110 is thereafter exposed within the opening 120a. The etchant to etch the first attenuating layer 120 may be designed to have a higher etching selectivity over the substrate 110. The etch selectivity is preferred to be no less than about 10. The patterned resist layer 150 is removed thereafter, using either wet stripping or plasma ashing.

The formed mask 100 includes a region 160 and a region 170, as illustrated in FIGS. 1e and 1f, which are referred to as a main feature 160 and an assistant feature 170, respectively. The main feature 160 is designed to form an integrated circuit pattern on a semiconductor wafer or other substrates. For example, the main feature 160 is designed to form a contact hole for an integrated circuit in a semiconductor wafer. The illustrated main feature for a contact hole is used only as an example, which can be designed in various other shapes and dimensions, and may be further designed to include other resolution enhancement features. Alternatively, the main feature 160 may be designed for other integrated circuit patterns such as a conductive line, source/drain, a gate feature, or a doped region. The main feature 160 has a width labeled as "W" in FIG. 1f.

The assistant feature 170 may be a scattering bar having a phase shift relative to the main feature 160. The assistant feature 170 includes exemplary segments 170a through 170f illustrated in FIG. 1f. Since the assistant feature 170 includes the first attenuating layer 120 while the main feature 160 does not, a radiation beam directed through the assistant feature 170 can have a phase shift relative to the radiation beam directed through the main feature, such as about 180 degrees or other designed phase shifts according to the thickness and refractive index of the first attenuating layer, as described above regarding to the first attenuating layer 120. The assistant feature 170 is spaced away from the main feature 160 with a distance labeled as "d" in FIG. 1f. The distance "d" may have a range up to multiple times of the width "W" of the main feature 160. Preferably, the distance "d" may have a range up to no greater than the four times of the width "W" of the main feature 160. The distance "d" may have a minimum dimension achievable in mask fabrication. The assistant feature 170 may have a width labeled as "S" and a length labeled as "L" in FIG. 1f. The width "S" of the assistant feature may be up to no greater than about two third of the width "W" of the main feature 160. The length "L" of the assistant feature may also have a range up to multiple times of the width "W" of the main feature 160. The assistant feature 170 may include several segments separate or connected. In one example, the assistant feature 170 may include various separate regions 170a through 170f disposed around the main feature 160 as illustrated in FIG. 1f. The smallest segment of the assistant feature 170 (such as 170e) may have a length "Ls" no less than about the minimum dimension achievable in mask fabrication. The distance between neighboring segments is no less than about the length "Ls". The assistant feature may alternatively be designed in other shapes, dimensions, and configurations. In various embodiment, the assistant feature may be designed to be rectangular, annular, a segment, or combinations thereof. In one example, various segments may be combined and connected to enclose the main feature inside.

Referring now to FIGS. 2a through 2e, an etching process according to one aspect of the present disclosure will be described. For purposes of illustration, a portion of a mask is shown in FIGS. 2a through 2e, and the mask is shown as having only a single attenuating layer. However, it is understood that the etching process described hereinafter is equivalently applicable for masks having multiple attenuating layers.

FIGS. 2a through 2e show a mask 200 similar in construction to the mask shown and described with respect to FIGS. 1a through 1e, absent the second attenuating layer. The mask has a substrate 210 with a layer of attenuating material 220 formed thereon. The layer of attenuating material 220 (not shown) is designed to provide a phase shift to a radiation beam used to fabricate a semiconductor wafer during a lithography process. The attenuating layer 220 may have a thickness such that a radiation beam directed toward and therethrough has a phase shift relative to the radiation beam directed through the air. The radiation beam is used on the mask 200 to form a pattern on a semiconductor wafer during a photolithography process. The radiation beam may be ultraviolet and/or can be extended to include other radiation beams such as ion beam, x-ray, extreme ultraviolet (EUV), deep ultraviolet (DUV), and other proper radiation energy. The thickness of the attenuating layer 220 may have a tolerance of plus or minus about 15 degrees in terms of optical phase. In one embodiment, the attenuating layer 220 has a phase shift about 180 degrees. More specifically, the attenuating layer 220 may have a thickness about $\lambda/[2(n-1)]$, wherein $\lambda$ is the wavelength of the radiation beam projected on the mask 200 during a photolithography process, and n is refractive index of the attenuating layer 220 relative to the specified radiation beam. In another embodiment, the attenuating layer 220 may have a phase shift ranging between about 120 degrees and 240 degrees. Specifically, the attenuating layer 220 may have a thickness ranging between $\lambda/[3\times(n-1)]$ and $2\lambda/[3\times(n-1)]$ to realize a desired phase shift. The attenuating layer 220 may have a transmission less than one (or 100%) and more than zero. In another example, the attenuating layer 220 may have a transmission higher than about 5%. The attenuating layer 220 may include metal silicide such as MoSi or $ToSi_2$, metal nitride, iron oxide, inorganic material, other materials such as Mo, $Nb_2O_5$, Ti, Ta, CrN, $MoO_3$, MoN, $Cr_2O_3$, TiN, ZrN, $TiO_2$, TaN, $Ta_2O_5$, $SiO_2$, NbN, $Si_3N_4$, ZrN, $Al_2O_3N$, $Al_2O_3R$, or combinations thereof. The method of forming the attenuating layer 220 may include chemical vapor deposition (CVD), physical vapor deposition (PVD), atomic layer deposition (ALD), plating, and/or other suitable processes.

Figure 2A:
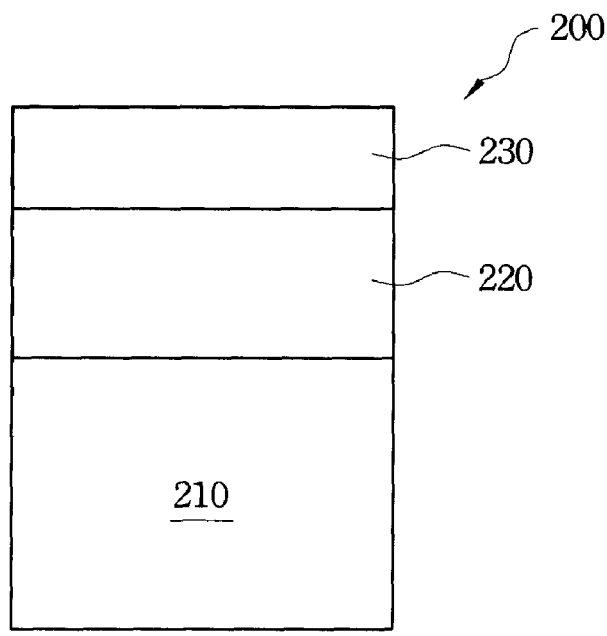
FIGS. 2a through 2e are sectional views of a portion of a mask at various fabrication stages to illustrate etching thereof according to one aspect of the present invention.
Figure 2B:
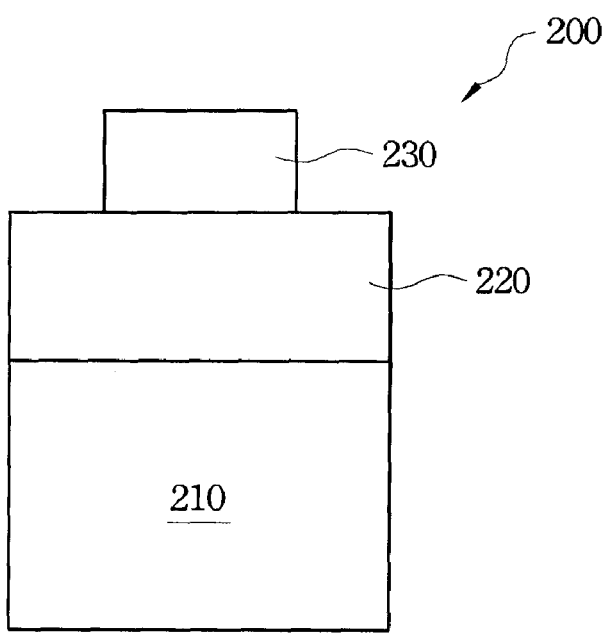
Figure 2C:
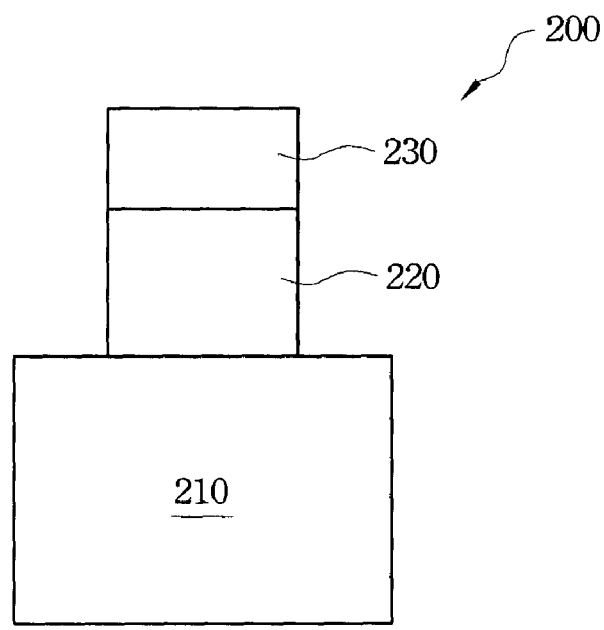

A hardmask or resist layer 230 is formed on the top surface of the attenuating layer 220. The resist layer 230 can be formed by a spin-on coating method. The resist layer 230 may include chemical amplification resist (CAR). As illustrated in FIG. 2b, the resist layer 230 is patterned to form a chip pattern to be printed on a semiconductor wafer (not shown) using a conventional process or a future developed technique. As will be explained in greater detail below, the resist pattern defines device features with a CD bias. That is, the device features, as patterned in the resist layer, are larger than will be defined in the attenuating layer.

Figure 2D:
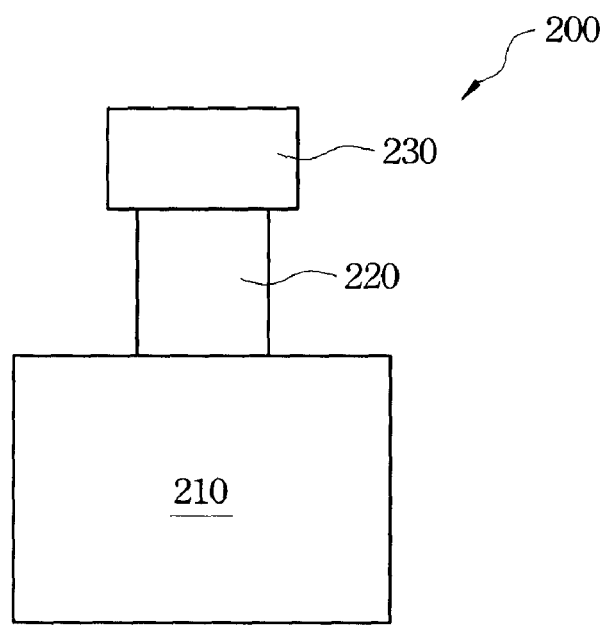
Figure 2E:
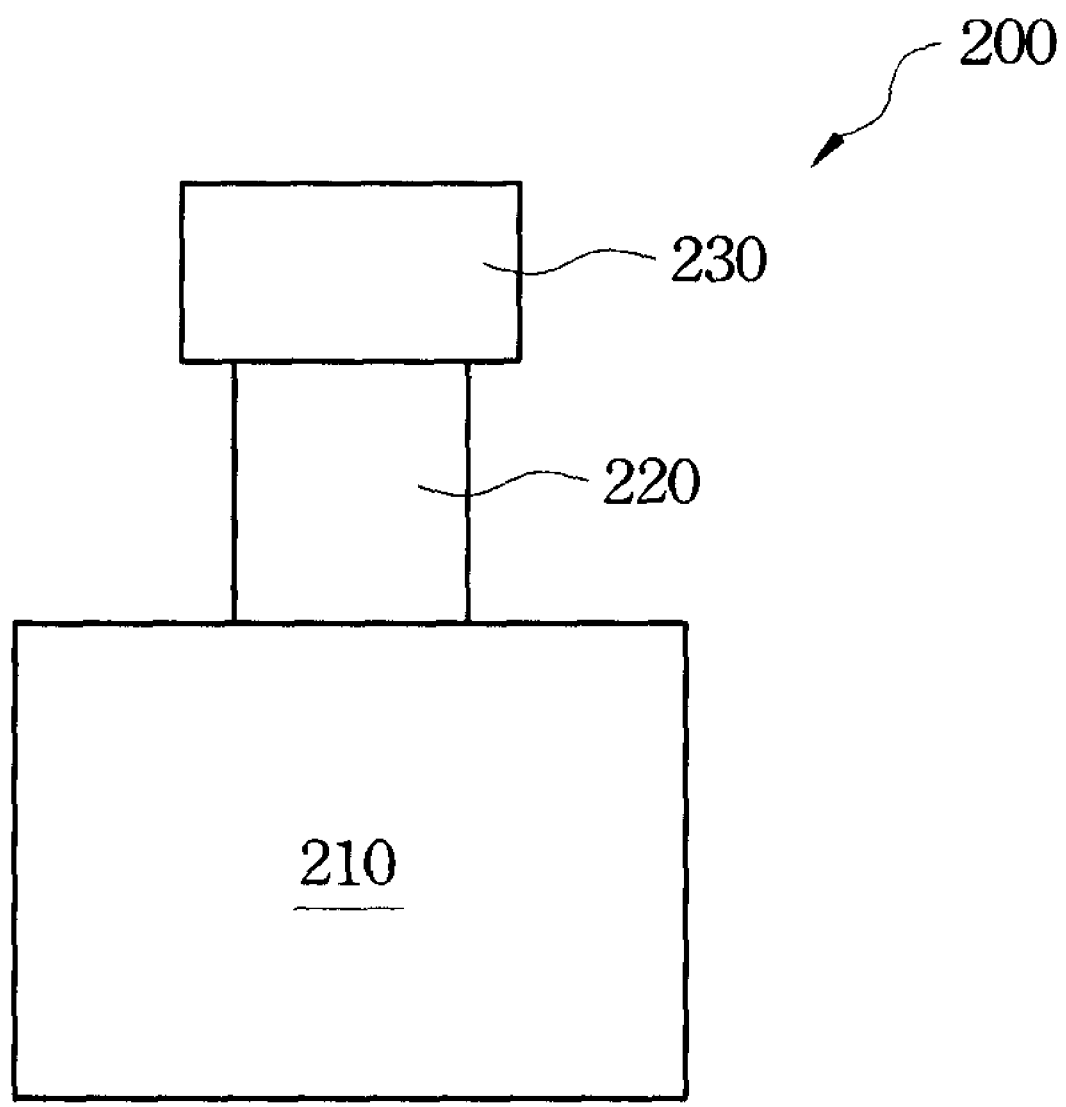

Following patterning of the resist layer 230, the attenuating or phase shifting layer 220 is developed in a two step etching process. While various etching processes may be used, in one embodiment, a two step dry etching process is used to etch the attenuating layer 220. The two step etching process includes two components: a main etching component and a side etching component. The main etching component is primarily responsible for etching the exposed portions of the attenuating layer and etching the substrate to provide a desired phase shift of the substrate. The over-etching time is primarily responsible for side etching of the unexposed portion of the attenuating layer. As shown in FIG. 2d, this side etching results in the CD of the attenuating layer being less than that of the resist layer. More particularly, the over-etching component removes the CD bias present in the attenuating layer following main etching. Following etching of the attenuating layer 220, the resist layer 230 is stripped using one of a number of conventional resist removal techniques.

Figure 3:
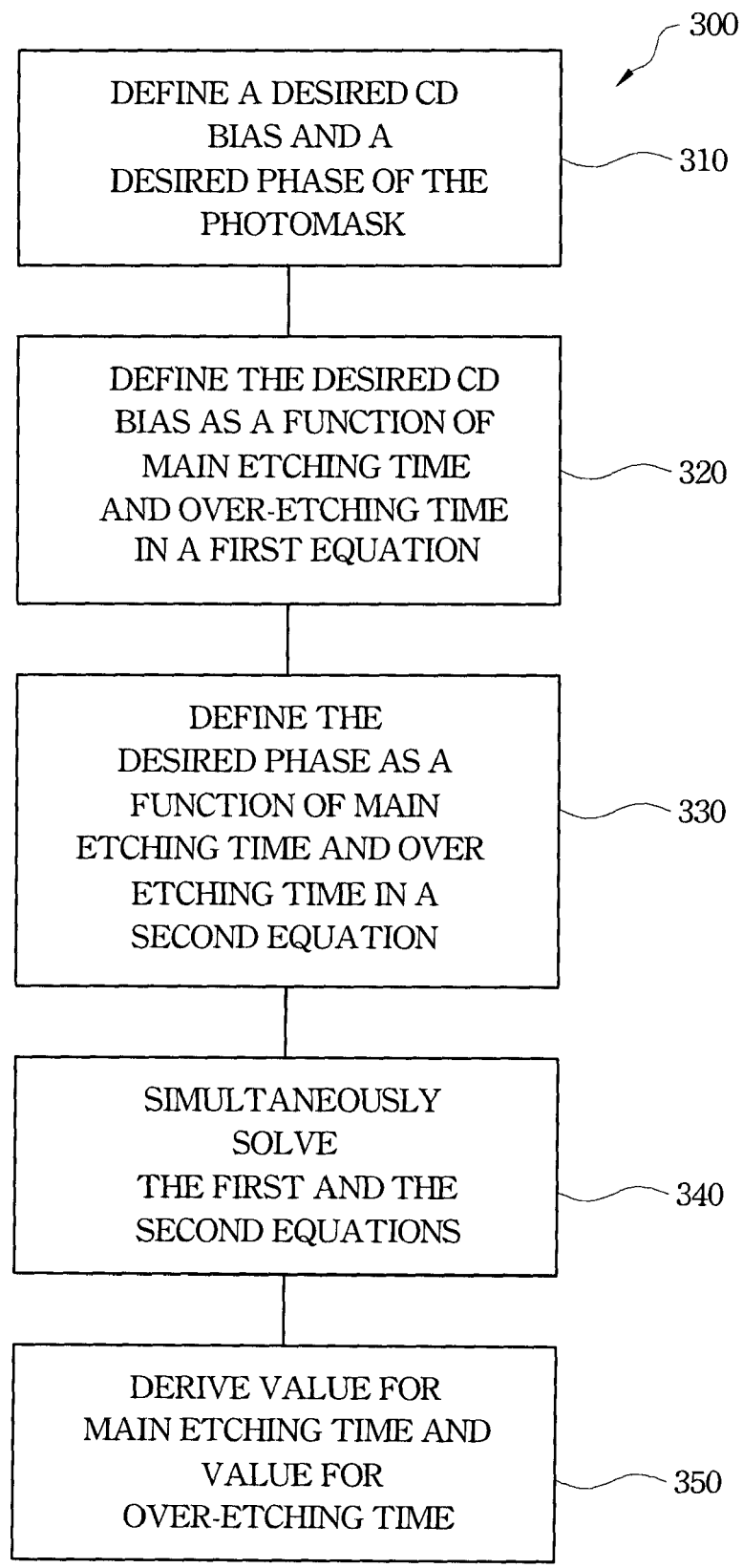
FIG. 3 is a flow chart setting forth the steps of determining a main etching time and an over-etching time according to another aspect of the present disclosure.

As described above, etching of the attenuating layer 220 has two components. In accordance with one aspect of the present disclosure, the main etching time and over-etching time are determined from the outset based on the amount of phase shift desired and the amount of CD bias to remove. A method of determining the main etching time and the over-etching time is illustrated in FIG. 3.

Method 300 begins at 310 with establishing a desired CD bias and a desired phase for the mask. CD bias is then mathematically defined in a first equation 320 as the sum of attenuating material to be removed during the main etching step and the over-etching bias. Similarly, the phase for mask is mathematically defined in a second equation 330 as the sum of the phase for the attenuating layer, e.g., MoSi film, and the substrate, e.g., quartz, etching depth. Thus, in one example, CD bias is defined as:

$$\text{CD Bias (nm)} = 0.16 \text{ (nm/s)} \times Tme \text{ (s)} + 0.57 \text{ (nm)} \times Toe \text{ (s)} \quad \text{(Eq. 1)},$$

and phase is defined as:

$$\text{Phase (degrees)} = 178.5 + (Tme \times 0.388 + Toe \times 0.182) \times 180 \times 2(n-1)/L \quad \text{(Eq. 2)},$$

where: 178.5 is shifter film (MoSi or others) phase shift degree.

Tme=main etching time–end point time, wherein end point time is the time at which etching time ends, Toe=over-etching time, n=refractive index of mask substrate, such as quartz etc., and L equals wavelength of the light used during exposure of the semiconductor wafer.

Thus, by establishing, from the outset, the desired CD bias value and the desired phase value, Equations 1 and 2 each have two unknowns: Tme and Toe. Therefore, Equations 1 and 2 can be solved simultaneously as a system of equations at 340 to derive values for Tme and Toe at 350. As such, values for main etching time and over-etching time can be determined simultaneously based on a desired CD bias and a desired phase for the mask. Etching of the mask, as described above, can then be carried out for a main etching time and for an over-etching time that will yield the desired parameters for the mask. Moreover, since main etching time and over-etching time are determined simultaneously, over-etching can be carried out after main etching without requiring an interruption in the process to determine the amount of over-etching needed. The present disclosure has been found effective in reducing phase variations in masks to as low as 1 degree. Moreover, while the present disclosure is applicable with various CD biases, it has been found to be particularly applicable for CD bias values between 70 nm to 32 nm.

The equations described above can be more generally defined as:

$$\text{Phase (degrees)} = Cn^*X^n + C(n-1)^*X^{(n-1)} + C^*X + Dn^*Y^n + D(n-1)^*Y^{(n-1)} + D^*Y + Z2,$$

$$\text{CD bias (nm)} = An^*X^n + A(n-1)^*X^{(n-1)} + A^*X + Bn^*Y^n + B(n-1)^*Y^{(n-1)} + B^*Y + Z1,$$

wherein X equals main etching time over end point time and Y equals over etching time.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A method comprising:
    setting a desired critical dimension (CD) parameter and a desired phase parameter for a mask, the mask including a phase shift layer;
    defining the desired CD parameter as a function of main etching time and over-etching time in a first equation;
    defining the desired phase parameter as a function of main etching time and over-etching time in a second equation;
    simultaneously solving the first and the second equations to determine a main etching time value and an over-etching time value;
    exposing the mask to a radiation; and
    patterning the mask, wherein the patterning includes main etching the mask for the main etching time value and over-etching the mask for the over-etching time value.

2. The method of claim 1 where the over-etching is carried out after the main etching without first measuring the CD of the mask.

3. The method of claim 1 wherein the mask has a phase that is within 1 degrees of the desired phase parameter following the main etching and the over-etching.

4. The method of claim 1 where the mask comprises a quartz substrate, a phase shift layer over the quartz substrate, and a hard mask layer over the phase shift layer.

5. The method of claim 1 wherein the over-etching time value is determined prior to main-etching of the mask.

6. The method of claim 1 wherein the desired CD parameter has a value less than 70 nm.

7. The method of claim 6 wherein the desired CD parameter has a value less than 45 nm.

8. The method of claim 7 wherein the desired CD parameter has a value of 32 nm.

9. A method comprising:
setting a desired critical dimension (CD) parameter and a desired phase parameter for an optical mask, the optical mask including a phase shift layer;
exposing the optical mask to a radiation;
determining a main etching time and an over-etching time for etching the optical mask to have the desired CD parameter and the desired phase parameter, wherein determining the main etching time and the over-etching time includes defining the desired CD parameter as a function of main etching time and over-etching time in a first equation; and then
performing main etching of the optical mask for the main etching time and over-etching of the optical mask for the over-etching time.

10. The method of claim 9 wherein determining the main etching time and the over-etching time further includes:
defining the desired phase parameter as a function of main etching time and over-etching time in a second equation; and
simultaneously solving the first and the second equations.

11. The method of claim 10 wherein,
the first equation is defined as $$\text{desired CD parameter (nm)} = 0.16(\text{nm/s}) \times Tme(s) + 0.57(\text{nm}) \times Toe(s);$$

and the second equation is defined as:

$$\text{desired phase parameter} = 178.5 + (Tme \times 0.388 + Toe \times 0.182) \times 180 \times 2(n-1)/L,$$

where:
Tme=main etching time
Toe=over-etching time
n=refractive index of the optical mask; and
L=wavelength of photo exposure.

12. The method of claim 9 wherein the desired CD parameter is a CD bias value.

13. The method of claim 12 wherein the CD bias value is less than 45 nm.

14. The method of claim 13 wherein the CD bias value is 32 nm.

15. A process comprising:
providing a mask substrate;
forming a phase shift layer over the mask substrate;
forming a hard mask layer over the mask substrate;
setting a desired critical dimension (CD) parameter and a desired phase parameter for the mask;
performing photo lithography on the mask substrate; and
main etching the phase shift layer for a main etching time and over-etching the phase shift layer of an over-etching time, wherein the main etching time and the over-etching time are determined by:
characterizing a desired phase parameter of the mask as a function of main etching time and over-etching time in a first equation;
characterizing a desired CD parameter as a function of over-etching time and main etching time in a second equation; and
simultaneously solving the first equation and the second equation to determine values for the main etching time and the over-etching time.

16. The process of claim 15 wherein the mask substrate is quartz and the phase shift layer is MoSi.

17. The process of claim 15,
wherein the second equation is defined as:

$$\text{desired CD parameter (nm)} = 0.16(\text{nm/s}) \times Tme(s) + 0.57(\text{nm}) \times Toe(s);$$

and wherein the first equation is defined as:

$$\text{desired phase parameter} = 178.5 + (Tme \times 0.388 + Toe \times 0.182) \times 180 \times 2(n-1)/L,$$

where:
Tme=main etching time
Toe=over-etching time
n=refractive index of mask; and
L=wavelength of photo exposure.

18. The process of claim 15 wherein the over-etching is carried out after the main etching without first measuring a critical dimension (CD) of the mask.

* * * * *